INVENTORS
SUSUMU AIZAWA
YOSHIBUMI GOMI

INVENTORS
SUSUMU AIZAWA
YOSHIBUMI GOMI

INVENTOR
SUSUMU AIZAWA
YOSHIBUMI GOMI

INVENTORS
SUSUMU AIZAWA
YOSHIBUMI GOMI

INVENTORS
SUSUMU AIZAWA
YOSHIBUMI GOMI

United States Patent Office 3,289,055

Patented Nov. 29, 1966

3,289,055

TEMPERATURE COMPENSATING CAPACITOR FOR QUARTZ CRYSTAL OSCILLATOR

Susumu Aizawa, Shimosuwa-machi, and Yoshibumi Gomi, Miyagawa, Chino-shi, Japan, assignors to Kabushiki Kaisha Suwa Seikosha, Tokyo, Japan, a corporation of Japan Filed Sept. 30, 1965, Ser. No. 491,660
10 Claims. (Cl. 317—248)

This invention relates to compensating for temperature effects in quartz crystal oscillators and more particularly to maintain constant the frequency of a quartz crystal oscillator independent of varying ambient temperature.

An object of the present invention is to substantially improve the temperature characteristics of a quartz crystal oscillator without the use of a thermostat.

Another object of the present invention is a temperature compensating device for a quartz crystal oscillator which consumes substantially no electric power.

Still another object of the present invention is to maintain constant the frequency of a quartz crystal oscillator independent of changes in the surrounding ambient temperature by utilizing a temperature compensating device.

In accordance with the present invention, there is provided a variable capacitor device coupled to a quartz crystal oscillator. The device is driven by a bimetal and the shape of the electrodes of the capacitor device is related to the displacement-temperature characteristics of the bimetal and the frequency-capacitance characteristics of the quartz crystal oscillator. In this manner, temperature effects of the oscillator are compensated to maintain the oscillator frequency constant as the ambient temperature varies.

For a more detailed disclosure of the invention and for further objects and advantages thereof, reference is to be had to the following description taken in conjunction with the accompanying drawings in which:

FIG. 1A schematically illustrates a crystal oscillator of the Colpitts type;

FIG. 1B schematically illustrates a crystal oscillator of the feedback type using a four-terminal crystal vibrator;

Figure 1A:
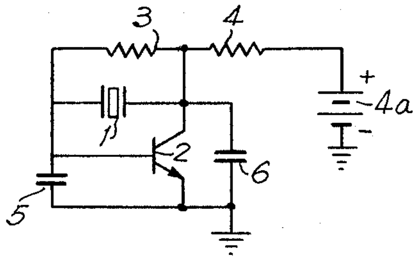

Referring now to FIG. 1A, there is shown a typical example of a transistor quartz crystal oscillator of the Colpitts type using a two terminal quartz crystal vibrator 1. The oscillator comprises an NPN transistor 2 having the quartz crystal 1 connected between its collector and base. A bias resistor 3 is connected across the crystal 1 and the collector of transistor 2 is coupled by way of a load resistor 4 to the positive side of a supply battery **4*a*, the negative side of which is connected to ground. A capacitor 6 is connected between the collector and emitter of transistor 2 while a capacitor 5 is connected between the base and emitter of that transistor. The values of resistors 3 and 4 and capacitors 5 and 6** are selected to provide oscillation at a desired frequency in the manner well known by those skilled in the art.

Figure 1B:
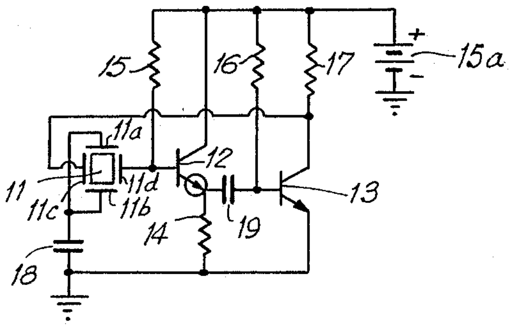

FIG. 1B illustrates an example of the oscillator circuit utilizing a quartz crystal of the four terminal type. As well known in the art such four terminal quartz crystals are used for low frequency purposes. The oscillator circuit of FIG. 1B comprises an NPN transistor 12 connected as an emitter-follower having its emitter connected by way of an emitter resistor 14 to ground and its base connected by way of a bias resistor 15 to the positive side of a battery **15*a*, the negative side of which is connected to ground. The base of the emitter-follower transistor 12 is also connected to electrode 11*d* of crystal 11 which has its opposing electrodes 11*a* and 11*b* connected together and by way of a capacitor 18 to ground. Capacitor 18 may be adjustable and adapted for providing small changes in the frequency of oscillations. Electrode 11*c* of crystal 11 is connected to a collector of a transistor 13 to provide amplification of the oscillations. A bias resistor 16 is connected between the base of transistor 13 and the positive side of battery 15*a* and a load resistor 17 is connected between the collector of transistor 13 and that positive side. It will be understood that with the emitter-follower transistor 12 being connected to the base of amplifier transistor 13 by way of a coupling capacitor 19** that an oscillator is formed of the feedback type. The various resistors and capacitors are selected to provide a desired oscillation frequency as well known in the art.

In either of the circuits of FIG. 1A or FIG. 1B, a quartz crystal vibrator is caused to vibrate in its inductive state. The equivalent inductance of the crystal is of such a large magnitude that the oscillating frequency of the circuit is determined almost entirely by the frequency of the crystal. However, strictly speaking, such a frequency does change, although slightly, due to the external circuit constants. Therefore, it has been a well known practice to perform minute adjustments of the oscillating frequency by means of the capacitor 5 of FIG. 1A or the capacitor 18 of FIG. 1B.

Figure 2:
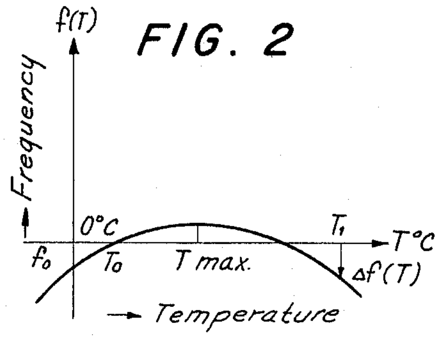
FIG. 2 illustrates the frequency-temperature characteristics of the oscillator shown in FIGS. 1A and 1B.
Figure 3:
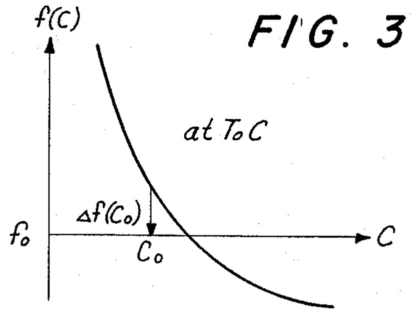
FIG. 3 illustrates the frequency-capacitance characteristics with variations of capacitance of the oscillator shown in FIGS. 1A and 1B.

The frequency-temperature characteristics of each of the oscillators of FIGS. 1A and 1B in which the respective crystals are of a DT or CT-cut or of a NT or XY-cut adapted to be used in the low frequency range, approximates very closely a second degree curve shown in FIG. 2. On the other hand, it has been found that the variation of oscillator frequency when the value of the capacitors 5 and 18 vary at a constant temperature $T_0$° C. can be represented by the characteristic curve as indicated in FIG. 3. In FIG. 3, the X-axis represents the capacitance value of the capacitors 5 and 18 and the Y-axis represents the oscillator frequency of the oscillator. Although the actual values represented by the X and Y-axis may be different in both the circuits of FIGS. 1A and 1B, the characteristic curves may be defined by almost equal equations and, therefore, can be represented by a single curve. $\Delta f(C_0)$ represents the variation in the oscillator frequency when the value of each of the capacitors 5 and 18 is $C_0$. Therefore, as can be seen in FIG. 3 compensation is essential in order to maintain the oscillator frequency at a constant value regardless of changes in the ambient temperature such as corresponding to a deviation from the center frequency at a temperature $T_1$° C., $\Delta f(T)$, as shown in FIG. 2. Such compensation may be provided by adjusting the value of capacitor 5 for the circuit of FIG. 1A and the capacitor 18 for the circuit of FIG. 1B.

Specifically, capacitors 5 and 18 may have their capacitance values changed at any temperature in accordance with the following equation:

$$\Delta f(T)+\Delta f(C)=0 \qquad (1)$$

Therefore, in accordance with the invention a temperature compensating capacitor 5, 18 is provided capable of satisfying Equation 1 at any temperature to maintain a constant oscillation frequency.

Figure 4:
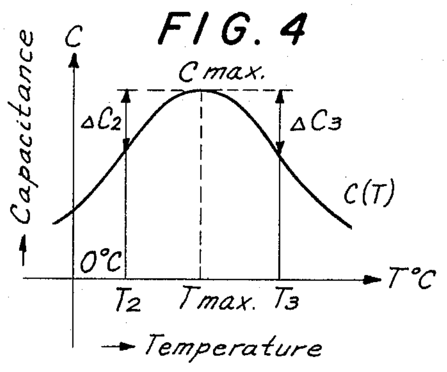
FIG. 4 illustrates temperature characteristics of the capacitance necessary to compensate for the characteristics shown in FIG. 2.

FIG. 4 represents the capacitance-temperature characteristic of the temperature compensating capacitor. There characteristics are obtained from the frequency-temperature characteristics of the crystal oscillator shown in FIG. 2 and the frequency-capacitance characteristics thereof shown in FIG. 3, and as defined by the equation:

$$\Delta f(T_0)=0.\left(\frac{\partial C}{\partial T}\right)f=\frac{\left(\frac{\partial f}{\partial T}C\right)}{\left(\frac{\partial f}{\partial C}T\right)} \qquad (2)$$

Figure 5:
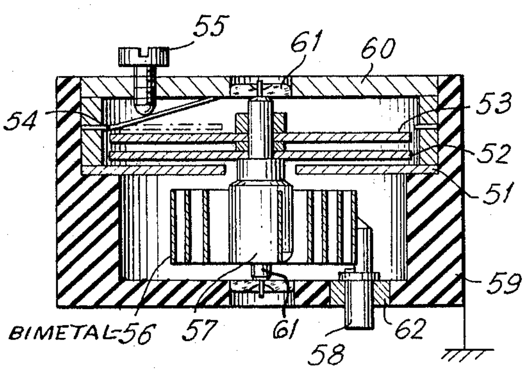
FIG. 5 is a sectional view of a temperature compensating capacitor device for a quartz crystal oscillator embodying the invention.
Figure 6:
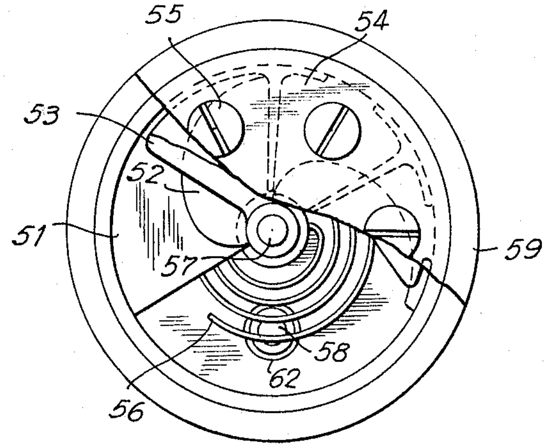
FIG. 6 is a plan view of the device shown in FIG. 5.

A temperature compensating capacitor of the present invention as shown in FIGS. 5 and 6 had capacitance-temperature characteristics of the type shown in FIG. 4. The capacitor comprises parallel spaced plates having air as a dielectric including a stationary electrode 51 and a rotating electrode 52. The capacitance between electrodes 51 and 52 compensates approximately for the frequency-temperature characteristic of a quartz crystal oscillator. In addition, an electrode 53 rotates with the electrode 52 in one unit, and a stationary electrode 54 which may be adjusted to vary the clearance between the rotating electrode 53 and the stationary electrode 54 by an adjusting screw 55. Such adjustment compensates for the slight error of the shape of electrodes 51 and 52 from the capacitance-temperature characteristics shown in FIG. 4. The rotating electrodes 52 and 53 are rotated by the expansions and contractions of a bimetallic member 56 due to variations in temperature. The bimetallic member 56 has its center secured to a rotating shaft 57 carrying and electrically connected to the rotating electrodes 52 and 53. One end of member 56 is fixed by a pin 58 to a metal housing 59 enclosing the electrode and bimetal structure. The pin 58 is electrically isolated from the case 59 and the stationary electrodes 51 and 54 by a non-conductive bushing 62. In this manner pin 58 forms an electrical connection to the rotatable electrodes from circuits external to the housing. The rotatable shaft 57 is electrically isolated by a jewel bearing 61 from the housing or case 59 and the stationary electrodes 51 and 54. Stationary electrodes are secured to and electrically connected to the housing 59 which is electrically grounded. Hereinafter electrodes 51 and 52 will be called respectively the first stationary electrode and the first rotating electrode, and electrodes 53 and 54 will be called respectively, the secondary rotating electrode and the secondary stationary electrode.

Figure 7:
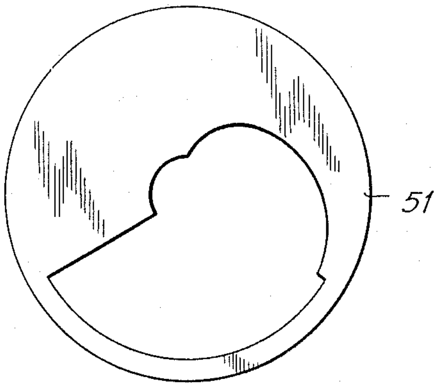
FIGS. 7, 8 and 9 show the shapes of the electrodes of the device shown in FIGS. 5 and 6.
Figure 8:
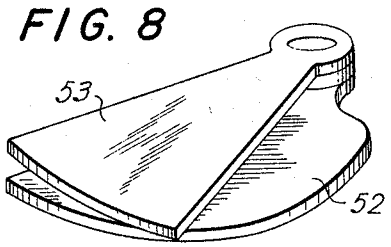
Figure 9:
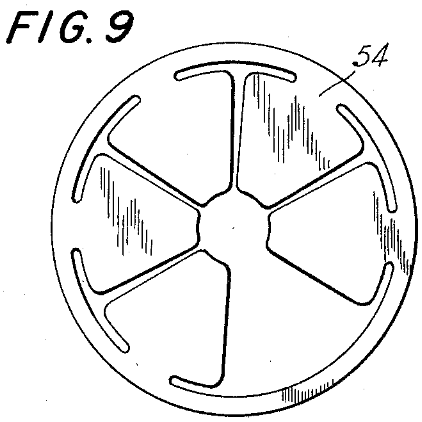

FIGS. 7 and 8 illustrate the individual plates 51–53. The secondary stationary electrode 54 as shown in FIGS. 5, 6 and 9 is mechanically divided into five electrode parts with each part electrically connected with the other. Each divided electrode part is changeable in position and shape by means of an adjusting screw 55 provided for each divided electrode. In this manner the clearance between the electrode parts and the rotating electrode 53 may be adjusted. The rotating electrodes 52 and 53 are designed to rotate through a predetermined angle 2 shown in FIG. 7 in a certain range.

Figure 10A:
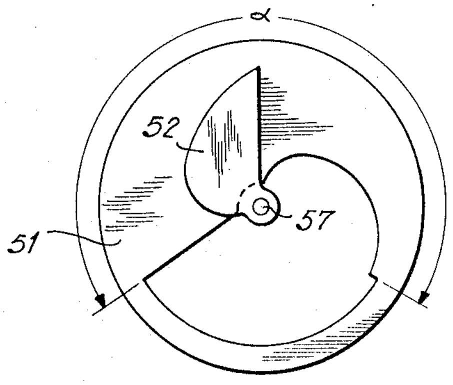
FIGS. 10A, 10B and 10C illustrate respectively the relative position of the rotating electrode and the stationary electrode shown in FIGS. 5 and 6 at three typical temperatures.
Figure 10B:
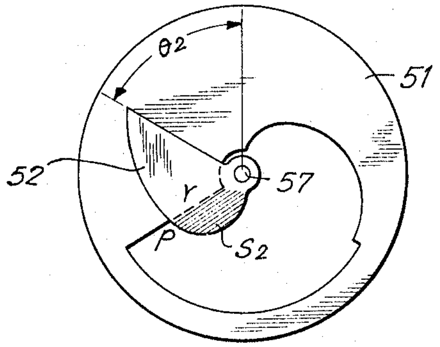
Figure 10C:
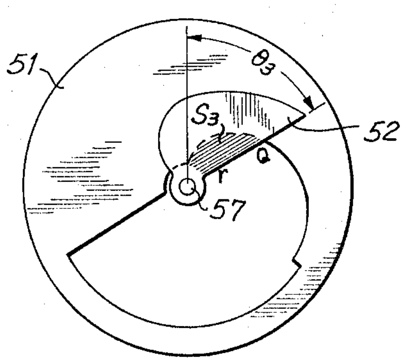

The positional relation of the first stationary electrode 51 and the first rotating electrode 52 at a typical temperature is illustrated in FIGS. 10A, 10B and 10C. In FIG. 10A, the temperature is $T_{max}$° C., FIG. 4, and the first rotating electrode 52 and the first stationary electrode 51 overlap each other completely, thereby indicating a maximum capacitance. Assuming that the total area of the rotating electrode to be S*t*, then $C_{max}$ in FIG. 4 can be expressed by the following equation:

$$C_{max}=\epsilon_0\cdot\frac{St}{g} \qquad (3)$$

Where $_0$ is the dielectric constant of the air.

At a temperature $T_2$, FIG. 4, the area $S_2$ of a portion of the first rotating electrode 52, FIG. 10B, which protrudes from the first stationary electrode 51 can be calculated from the configuration of the external curve, on the left side of the first rotating electrode 52 by the following equation:

$$S_2=\int_0^{\theta_2}\frac{r^2}{2}d\theta \qquad (4)$$

wherein $\theta_2$ is the angle of revolution and the decrease in capacitance is adjusted to be equal to $\Delta C_2$, FIG. 4, that is:

$$\Delta C_2=\epsilon_0\frac{S_2}{g} \qquad (5)$$

where "*r*", as shown in FIG. 10B is the distance between (1) a cross point P of the external curve of the first rotating electrode and of the external straight line of the first stationary electrode and (2) the center 57 of rotation, and "*g*" is the gap distance between the first stationary electrode 51 and the first rotating electrode 52.

At a temperature $T_3$, FIG. 4, the area $S_3$ of a portion of the first rotating electrode 52, as shown in FIG. 10C, which protrudes from the first stationary electrode 51 can be calculated from the configuration of the external curve, on the right side of the first stationary electrode 51 by the following equation:

$$S_3=\int_0^{\theta_3}\frac{r^2}{2}d\theta \qquad (6)$$

wherein $\theta_3$ is the angle of revolution and the decrease in capacitance is adjusted to be equal to $C_3$, FIG. 4. The external curve on the right side of the first stationary electrode 51, i.e., "*r*", is defined to satisfy the equation:

$$\Delta C_3=\epsilon_0\frac{S_3}{g} \qquad (7)$$

where "*r*" is the distance between (1) a cross point Q of the external curve of the first stationary electrode end of the external straight line of the first rotating electrode and (2) the center 57 of rotation, and "*g*" is the gap distance between the first stationary electrode 51 and the first rotating electrode 52.

The relationship expressed by Equations 5 and 7 may be established at any desired temperature. However, it will be understood that it is rather difficult to exactly establish the relationship defined by Equations 5 and 7, with a temperature compensating capacitor having only a first stationary and a first rotating electrode.

In order to provide a temperature compensating capacitor for a quartz crystal oscillator which maintains a substantially constant frequency as defined by Equations 5 and 7, the secondary stationary and rotating electrodes are required. As shown in FIG. 5, the secondary stationary electrode 54 laps over the secondary rotating electrode 53 and in this way the secondary electrodes provide precise adjustment of the oscillator frequency. It will be understood that the capacitance between the secondary stationary and rotating electrodes, varies in accordance with the distance between those electrodes. The secondary stationary electrode 54, for precise adjustment may be divided into five parts as shown in FIG. 9, in order to adjust the oscillation frequency at five different temperatures, as for example, 0° C., 10° C., 20° C., 30° C. and 40° C.

In accordance with the invention, with the capacitance of the secondary electrodes 53 and 54 in parallel with the first electrodes, a precise adjustment of the oscillation frequency may be made.

Figure 12:
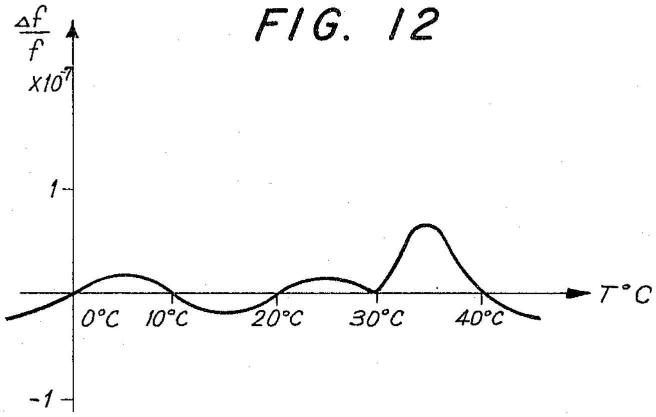
FIG. 12 illustrates the frequency-temperature characteristics of a quartz crystal oscillator having a temperature compensating device of the present invention.

A frequency-temperature characteristic of a crystal oscillator is shown in FIG. 12 having a temperature compensating capacitor, FIG. 5, in which, for example, a four terminal XY-cut quartz crystal is oscillated in the circuit shown in FIG. 1B. In FIG. 1B with the capacitor 18 being a temperature compensating capacitor, there may be obtained a frequency deviation of about $1 \times 10^{-7}$ in the temperature range from 0° C. to 40° C. However, the temperature characteristics of a practical crystal oscillator may not be as smooth as that shown in FIG. 2. A complicated curve may occasionally be produced due to the influence of the twin crystal or the like. Accordingly, better compensation results may be obtained by utilizing the secondary stationary and rotating electrodes. These secondary electrodes may be adjusted to eliminate errors in the capacitance-temperature characteristics provided by the first stationary and rotating electrodes, from the capacitance-temperature characteristics given by equation 1.

As previously described, the first stationary and rotating electrodes provide approximate adjustment of the temperature characteristics of a quartz crystal oscillator. The frequency of a quartz crystal oscillator may be adjusted with substantial precision by the secondary electrodes. For the characteristics shown in FIG. 12, it is preferable that the secondary stationary electrode 54 be divided into nine parts, for example, to adjust the frequency at 0° C., 5° C., 10° C., 15° C., 20° C., 25° C., 30° C., 35° C. and 40° C.

Figure 11:
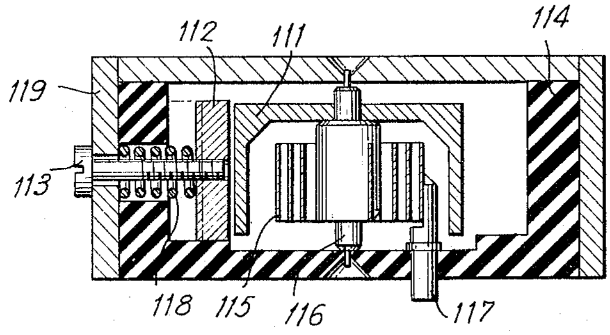
FIG. 11 is a sectional view of another embodiment of the present invention.

The principles of the invention having now been explained it will be understood that many more modifications and embodiments may be made all in accordance with the invention. For example, as shown in FIG. 11, the clearance between the secondary stationary and rotating electrodes may be adjusted by an adjusting screw 113. A bimetallic member 115 is mounted on and secured at its center to a rotating shaft 116. An end of member 115 is secured to a nonconductive housing 114 by a pin 117 disposed in the housing and forming an electrical terminal. The secondary rotating electrode 111 disposed in housing 114 is formed in the shape of a cylinder open at its bottom end and secured at the center of its upper end to shaft 116. The secondary stationary electrode 112 is disposed parallel to the wall of the cylindrical electrode 111 and may be adjusted to differing positions between its illustrated and dotted line positions by means of adjusting screw 113 and biasing spring 118. In this manner the capacitance may be adjusted to provide the compensation as previously described.

It will also be understood that instead of air as the fluid within the housing 114, another fluid liquid or gaseous may be utilized having a high dielectric constant.

Figure 13:
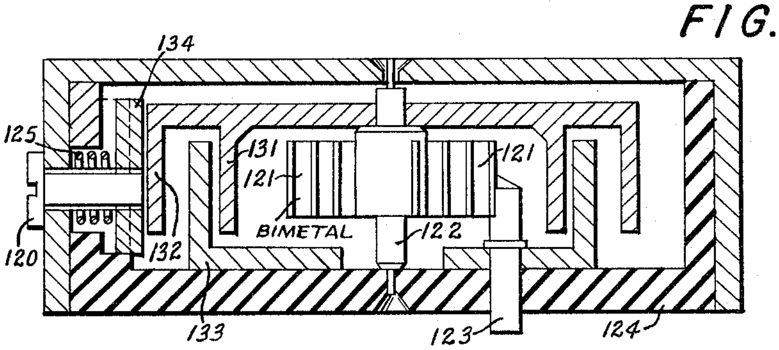
FIG. 13 is a sectional view of a further embodiment of the present invention.

FIG. 13 illustrates a further embodiment of the present invention in which the second rotatable electrode is cylindrically shaped.

In FIG. 13, the clearance between both of the secondary stationary and rotating electrodes may be adjusted by an adjusting screw 120.

A bimetallic member 121 is mounted on and secured at its center to a rotating shaft 122. An end of member 121 is secured to a nonconductive housing 124 by a pin 123 disposed in the housing and forming an electrical terminal.

The first rotating electrode 131 and the secondary rotating electrode 132 disposed in housing 124 are formed in shape of a concentric double cylinder opened at its bottom end and secured at the center of its upper end to the shaft 122. The secondary stationary electrode 134 is disposed parallel to the wall of the cylindrical secondary rotating electrode 132 and may be adjusted between its illustrated and dotted line positions by means of the adjusting screw 120 and the biasing screw 125.

The capacity formed in the clearance between the first rotating and stationary electrodes is designed so as to approximately compensate for the temperature frequency characteristics of a quartz oscillator. It is preferable for the first cylindrical stationary electrode 133 to be disposed at a position nearer to the wall of the first rotating electrode than that of the secondary rotating electrode as shown in FIG. 11.

What is claimed is:

1. A capacitor for temperature compensating the frequency-temperature characteristics of a quartz crystal oscillator comprising a first stationary electrode and a first rotatable electrode, means for rotating said first rotatable electrode in capacitive relation with said first stationary electrode as a function of change in ambient temperature, said first stationary and rotatable electrodes having shapes to approximately compensate for the frequency-temperature characteristics of said oscillator upon rotation of the electrodes one with respect to the other, a second rotatable electrode secured to and electrically connected to said first rotatable electrode for rotation therewith, and adjusting means including a second stationary electrode for varying the clearance between said second stationary electrode and said second rotatable electrode to provide precise compensation for said frequency-temperature characteristics.

2. The capacitor of claim 1 in which said first electrodes and said second electrodes comprise flat plates spaced parallel one with the other and in which said second stationary electrode is divided into at least two parts.

3. The capacitor of claim 2 in which said adjusting means includes an adjusting screw for each of said second stationary electrode parts for varying the distance between its respective part and said second rotatable electrode.

4. A capacitor for temperature compensating the frequency-temperature characteristics of a quartz crystal oscillator comprising, a first stationary electrode and a first rotatable electrode, means for rotating said first rotatable electrode in capacitive relation with said first stationary electrode as a function of change in ambient temperature, said first stationary and rotatable electrodes having shapes to approximately compensate for the frequency-temperature characteristics of said oscillator upon rotation of the electrodes one with respect to the other, a second rotatable electrode secured to and electrically connected to said first rotatable electrode for rotation therewith, and adjusting means including a second stationary electrode for varying the clearance between said second secondary electrode and said second rotatable electrode to provide precise compensation for said frequency-temperature characteristics, said second rotatable electrode being formed in the shape of a cylinder, and said second stationary electrode being disposed parallel to the wall of said second rotatable electrode and adjusted to vary the clearance between said second stationary and rotatable electrodes.

5. A capacitor for temperature compensating the frequency-temperature characteristics of a quartz crystal oscillator, comprising means for connecting said capacitor in an oscillator circuit, a first stationary electrode and a first rotatable electrode, bimetallic means for rotating said first rotatable electrode adjacent said first stationary electrode, said first stationary and said first rotatable electrodes having shapes to approximately compensate for the frequency-temperature characteristics of said quartz crystal oscillator as said first rotatable electrode rotates, a second rotatable electrode secured to said first rotatable electrode for rotation therewith, a second stationary electrode divided into at least two parts, and means for adjusting the parts of said second stationary electrode to vary the clearance between said second rotatable electrode and said second stationary electrode to compensate for errors in shape of said first stationary and rotatable electrodes.

6. The capacitor of claim 5, in which said each of first electrodes and each of said second electrodes comprise flat plates spaced substantially parallel one with the other and said second stationary electrode is divided into a plurality of substantially equal parts forming individual flat plates.

7. The capacitor of claim 6 in which said adjusting means includes an adjusting screw for each of said electrode parts for varying the distance between its respective part and said second rotatable electrode.

8. A capacitor for temperature compensating the frequency-temperature characteristics of a quartz crystal oscillator, comprising, means for connecting said capacitor in an oscillator circuit, a first stationary electrode and a first rotatable electrode, bimetallic means for rotating said first rotatable electrode adjacent said first stationary electrode, said first stationary and said first rotatable electrodes having shapes to approximately compensate for the frequency-temperature characteristics of said quartz crystal oscillator as said first rotatable electrode rotates, a second rotatable electrode secured to said first rotatable electrode for rotation therewith, a second stationary electrode divided into at least two parts, and means for adjusting the parts of said second stationary electrode to vary the clearance between said second rotatable electrode and said second stationary electrode to compensate for errors in shape of said first stationary and rotatable electrodes, said second rotatable electrode being formed in the shape of a cylinder, and said second stationary electrode being formed in the shape of a plate disposed parallel to the wall of said second rotatable electrode and being adjusted to vary the clearance between said second electrodes.

9. A temperature compensating capacitor for a quartz crystal oscillator comprising a housing forming an enclosure for said capacitor, a first stationary electrode disposed within said enclosure and secured to said housing and a first rotatable electrode disposed within said enclosure, bimetallic means for rotating said first rotatable electrode in capacitive relation with said first stationary electrode, said first electrodes having shapes to approximately compensate for the frequency-temperature characteristics of said oscillator, a second rotatable electrode secured to said first rotatable electrode for rotation therewith within said enclosure, a second stationary electrode disposed within said enclosure and secured to said housing and divided into a plurality of parts, and screw means disposed in said housing and adjustable from the exterior of said enclosure for adjusting the parts of said second stationary electrode to vary the clearance between said second rotatable electrode and said second stationary electrode to compensate for any errors in the shapes of said first electrodes to precisely compensate for said frequency-temperature characteristics.

10. The capacitor of claim 9 in which there is provided a fluid material of high dielectric constant within said enclosure.

References Cited by the Examiner

UNITED STATES PATENTS

| | | | |
|---|---|---|---|
| 1,588,438 | 6/1926 | Bliss | 317—254 |
| 1,987,124 | 1/1935 | Muller | 317—254 X |
| 2,182,645 | 12/1939 | Seibert | 317—258 |
| 3,217,216 | 11/1965 | Dotto | 317—254 |

LEWIS H. MYERS, *Primary Examiner.*

LARAMIE E. ASKIN, *Examiner.*

G. GOLDBERG, *Assistant Examiner.*